United States Patent [19]

Takeuchi et al.

[11] Patent Number: 4,855,994

[45] Date of Patent: Aug. 8, 1989

[54] MEMORY PACKAGE SYSTEM FOR PERFORMING DATA TRANSMISSION BETWEEN MEMORY MODULE AND WRITE/READ UNIT BY ELECTROMAGNETIC INDUCTION COUPLING

[75] Inventors: Kunihiko Takeuchi, Kawasaki; Masao Oba, Yokohama; Shinichi Horinouchi, Tokyo, all of Japan

[73] Assignee: Tokyo Keiki Company Ltd., Tokyo, Japan

[21] Appl. No.: 141,222

[22] Filed: Jan. 6, 1988

[30] Foreign Application Priority Data

Jan. 26, 1987 [JP] Japan ................................ 62-15784

[51] Int. Cl.$^4$ .............................................. H04J 1/00
[52] U.S. Cl. .............................. 370/69.1; 365/189.02; 365/189.12
[58] Field of Search ................. 370/69.1, 76; 365/189, 365/198; 340/825.54

[56] References Cited

U.S. PATENT DOCUMENTS

| | | | |
|---|---|---|---|
| 3,735,266 | 5/1973 | Amitay | 370/69.1 |
| 4,731,761 | 3/1988 | Kobayashi | 365/189 |
| 4,758,995 | 7/1988 | Sato | 365/189 |

Primary Examiner—Douglas W. Olms
Assistant Examiner—Min Jung
Attorney, Agent, or Firm—Wenderoth, Lind & Ponack

[57] ABSTRACT

The bidirectional transmission for reading and writing data is performed between a write/read unit and a memory module using the contactless induction coupling of induction coils. The write/read unit frequency multiplexes a power source signal, a sync clock, and an enable clock and transmits the frequency multiplexed signals to the memory module. The memory module rectifies the received frequency multiplexed signals to produce an operating power source and to reproduce the sync clock and enable clock and to form an enable signal from the OR of both clocks. The write and read access information transmitted through another route is read in response to the reproduced sync clock and enable signal, thereby executing the writing and reading operations of a non-volatile memory.

6 Claims, 5 Drawing Sheets

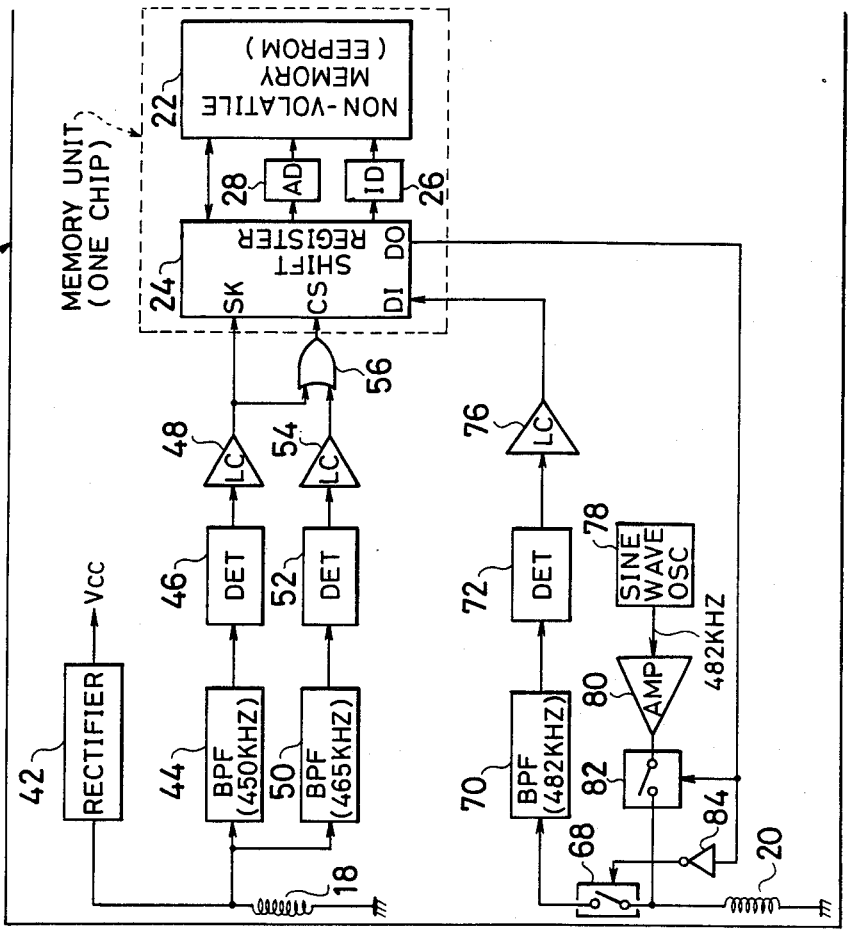
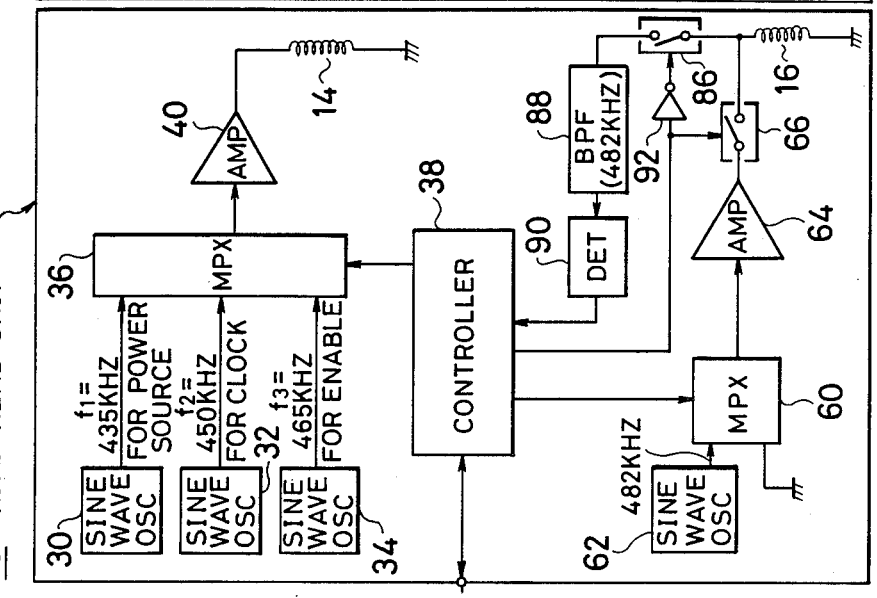
FIG.1

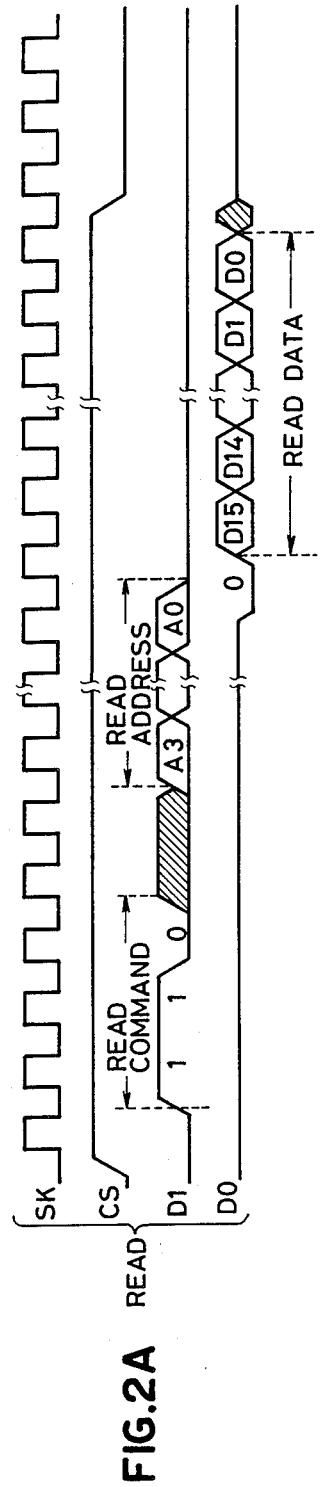
FIG.2A READ
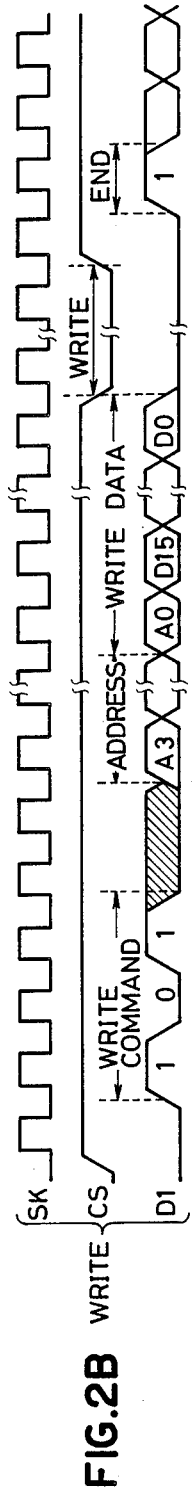
FIG.2B WRITE
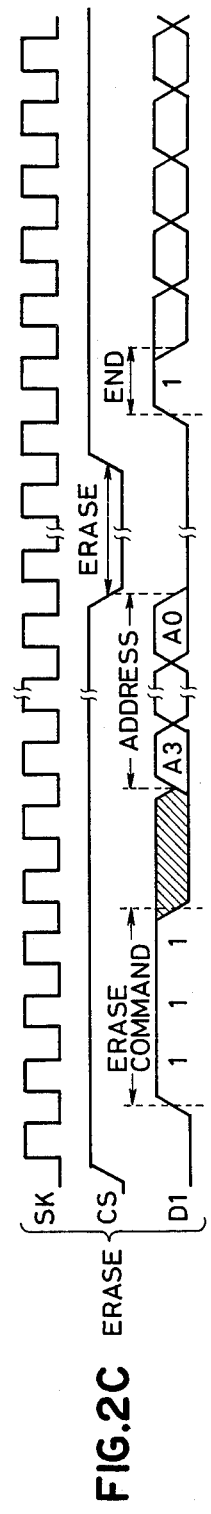
FIG.2C ERASE

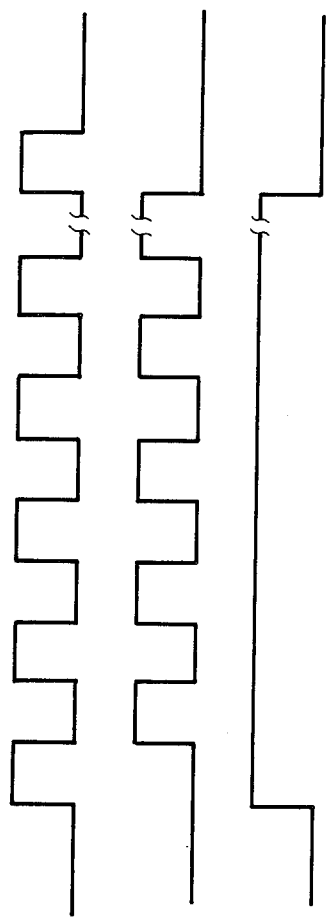

MEMORY PACKAGE SYSTEM FOR PERFORMING DATA TRANSMISSION BETWEEN MEMORY MODULE AND WRITE/READ UNIT BY ELECTROMAGNETIC INDUCTION COUPLING

BACKGROUND OF THE INVENTION

The present invention relates to a memory package system in which data is exchanged between a memory module and a write/read unit by contactless induction coupling.

In U.S. patent application Ser. Nos. 07/048832 and 07/053759, the inventors of the present invention have proposed systems in which in order to write and read data by a write/read unit into and from a non-volatile memory, e.g., an EEPROM provided in a memory module in a contactless manner, induction coils are assembled into the write/read unit and memory module. In the writing or reading mode, both induction coils are disposed so as to face each other at a predetermined gap interval, and an operating electric power is supplied to the memory module and the write/read data is serially transmitted into/from the memory module by the resultant electromagnetic induction coupling.

According to the power supply to the memory module and the data transmission for writing or reading by such a contactless induction coupling system, when the number of kinds of signals increases, the number of induction coils which are provided for the write/read unit and memory module also increases. To solve this problem, the systems disclosed in U.S. patent application Ser. Nos. 07/048832 and 07/053759 use a start-stop communication system in which there is no need to transmit transmission/reception sync clocks (shift clocks) as a communication system for transmitting serial data and converting into parallel data. Namely, according to the start-stop communication system, it is sufficient to transmit between the write/read unit and the memory module three kinds of signals: a power source signal which is sent from the write/read unit to the memory module; an up-signal to write or read; and a down-signal serving as a read data which is returned from the memory module to the write/read unit.

As mentioned above, since the number of kinds of transmission signals can be reduced to three, the start-stop communication system has an advantage in that the number of induction coils which are used to couple the write/read unit with the memory module in a contactless induction coupling manner can be reduced. However, according to this system, a communication controller for the start-stop communication control, which is known as an USART, needs to be provided in each of the write/read unit and memory module. In this kind of memory package system, it is desired to miniaturize the memory module. However, the start-stop communication system has a problem in that the memory module increases in size by an amount corresponding to the size of the communication controller (USART).

Additionally, the start-stop communication system synchronizes the shift clocks reproduced from the reception signal with the received data bits and converts the received serial data into the parallel data, so that data errors are likely to occur as compared with the case where the transmission/reception sync clocks are used. Consequently, this system certainly requires an error control such as a parity check or the like and when errors were detected, a request for retransmission is repeatedly generated until the correct data can be received, so that the communication time to write and read is prolonged.

SUMMARY OF THE INVENTION

It is an object of the present invention to provide a memory package system in which the bidirectional data transmission is executed between a write/read unit and a memory module by the contactless induction coupling with a simple circuit constitution.

Another object of the invention is to provide a memory package system in which the bidirectional data transmission is executed between the write/read unit and the memory module without increasing the number of induction coils required for the contactless induction coupling.

Still another object of the invention is to provide a memory package system in which the bidirectional data transmission is performed between the write/read unit and the memory module without a dedicated communication controller used in a start-stop communication system.

Still another object of the invention is to provide a memory package system in which a power source signal, transmission/reception sync clock signals, and enable clock signals are multiplexed by the write/read unit and serially transmitted to the memory package, and by reproducing the serial data in the memory package, the clock signals and an enable signal which are necessary to write access or read access are formed.

Still another object of the invention to provide a memory package system comprising: a pair of induction coils (for up-transmission) to transmit a signal which is derived by multiplexing a power source signal, transmission/reception sync clock signals, and enable clock signals from a write/read unit to a memory module; and another pair of induction coils (for bidirectional transmission) to transmit the serial converted write data or read data between the write/read unit and the memory module.

Namely, according to the invention, in the write/read unit, three signals consisting of a power source signal to supply an operating electric power to the memory package, a write/read control signal, and transmission/reception sync clock signals are frequency modulated and thereafter, they are time-sharingly multiplexed and transmitted to the memory module by the contactless induction coupling using a pair of induction coils for up-transmission.

Additionally, in the write/read unit, the serial bit data is frequency modulated and another pair of electromagnetic induction coils which are used for bidirectional transmission are switched into an up-signal transmitting mode, and a write command, a write address, and write data in the write access mode or a read command, and a read address in the read access mode are transmitted to the memory module. On the other hand, the read data from the memory module which was read accessed is frequency modulated and transmitted by switching the same induction coils into the transmitting mode of the down-signal.

Therefore, according to the invention, the power source signal, transmission/reception sync clock signals, and enable clocks which were time-sharingly multiplexed after completion of the frequency modulation are transmitted to the memory module through the induction coils used for only the up-transmission, so that the operating power source for the memory module is obtained by rectifying all of these reception signals. Additionally, the transmission/reception sync clock signals and enable signal which are used for the read access or write access of the memory can be individually demodulated from the frequency signals induced in the induction coils for only the up-transmission.

Therefore, the data reading operation based on the read access information and the data writing operation based on the write access information by the induction coils for the bidirectional transmission can be executed for a non-volatile memory, e.g., EEPROM by a simple circuit without requiring any special communication controller.

Thus, since the transmission/reception sync clocks (shift clocks) are transmitted, a special communication controller for serial-to-parallel conversion as in the start-stop communication system is not needed. so that the memory module can be miniaturized by an amount corresponding to the size of such a controller. On the other hand, since the transmission/reception sync clocks are transmitted, the reliability in data transmission is improved. The error control as in the start-stop communication system is unnecessary and the communication time to write and read can be reduced.

BRIEF DESCRIPTION OF THE DRAWINGS

FIG. 1 is a system block diagram showing an embodiment of the present invention;

FIG. 2A is a timing chart showing a read control for a memory module;

FIG. 2B is a timing chart showing a write control for the memory module;

FIG. 2C is a timing chart showing an erase control for the memory module;

FIG. 3A is a signal waveform diagram of sync clocks which are reproduced in the memory module;

FIG. 3B is a signal waveform diagram of enable clocks which are reproduced in the memory module;

FIG. 3C is a signal waveform diagram of an enable signal which is formed in the memory module;

DETAILED DESCRIPTION OF A PREFERRED EMBODIMENT

Figure 4:
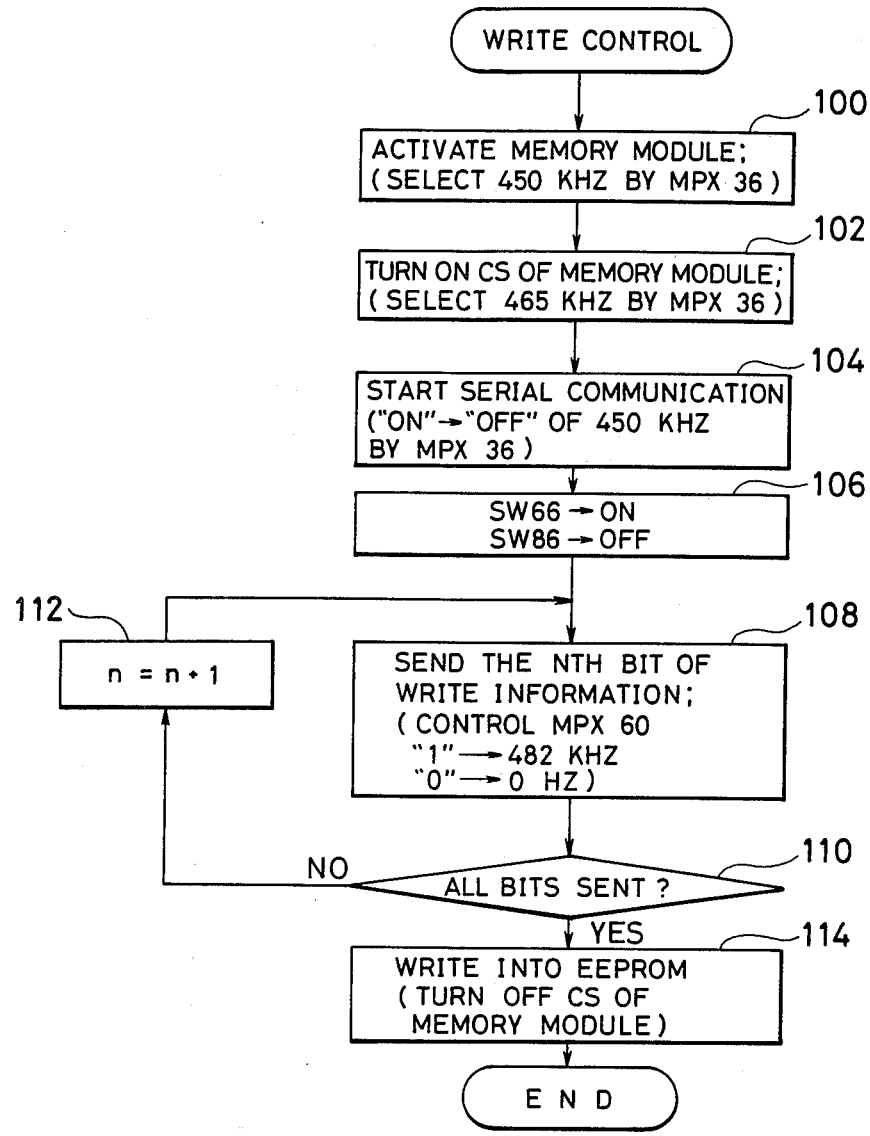
FIG. 4 is a flowchart showing a write access in FIG. 1.

In FIG. 1, reference numeral 10 denotes a write/read unit and reference numeral 12 denotes a memory module having therein a non-volatile memory.

The write/read unit 10 has a first induction coil 14 for transmitting a power source signal and an up-signal to the memory module 12 and a second induction coil 16 for performing the bidirectional transmission of write/-read information with the memory module 12. A third induction coil 18 provided in the memory module 12 is disposed so as to face the first induction coil 14 for receiving the power source signal and up-signal at a predetermined gap interval. The operating electric power of the power source signal and the up-signal can be transmitted from the write/read unit 10 to the memory module 12 by contactless induction coupling using the induction coils 14 and 18.

A fourth induction coil 20 is also provided in the memory module 12 so as to face the second induction coil 16 in the write/read unit 10 at a predetermined gap interval. The contactless induction coupling by the induction coils 16 and 20 makes it possible to perform the bidirectional transmission of the up-signal to the write access or read access from the write/read unit 10 to the memory module 12 and of the down-signal to return the read data of the memory module 12 which was read accessed to the write/read unit 10. A non-volatile memory 22 using an EEPROM is provided in the memory module 12. The memory 22 has a shift register 24 in the same chip. The shift register 24 converts the write data which was serially transmitted from the outside into the parallel data and also converts the parallel data read out of the memory 22 into the serial data and then transmits.

As a memory unit in which the shift register 24 to perform the serial-to-parallel conversion is provided in the same chip, for example, it is possible to use an EEPROM with a communicating function such as NMC9306 made by National Semiconductor Co., Ltd. or X2404 made by XICOR Co., Ltd. or the like.

For example, in the case of using the NMC9306 made by National Semiconductor Co., Ltd. as a memory unit having therein the non-volatile memory 22, as shown in FIG. 1, the shift register 24 has a shift clock terminal SK, a chip selecting terminal (enable terminal) CS, a serial data input terminal DI, and a serial data output terminal DO. In the enable state to set the chip selecting terminal CS to the H level, when a shift clock is supplied to the shift clock terminal SK, the shift register 24 reads the serial data given to the serial data input terminal DI synchronously with the shift clock and converts into the parallel data. The reading or writing operation of data can be performed for the memory 22. An instruction decoder 26 to for interpreting a write command and a read command and an address decoder 28 for designating a write address or a read address are provided between the shift register 24 and the memory 22.

FIGS. 2A, 2B, and 2C are timing charts showing a read control, a write control, and an erase control for the memory 22 by the shift register 24 provided in the memory module 12 shown in FIG. 1, respectively.

First, in the read control shown in FIG. 2A, when the chip selecting terminal CS is set to the H level after a shift clock was supplied to the shift clock terminal SK, the enable state in which data can be read from the serial data input terminal DI is obtained. In this state, if a read command "110" of three bits and an arbitrary read address "$A_3 A_2 A_1 A_0$" consisting of four bits are given to the serial data input terminal DI, the respective bits of the read command and read address are converted into the parallel data synchronously with the shift clocks SK. The read command is interpreted by the instruction decoder 26 and the reading mode is set into the memory 22. The read address is interpreted by the address decoder 28 and the read address is designated in the memory 22. When the read command and read address which were converted into the parallel data by the shift register 24 are given to the memory 22, the memory 22 reads out the read data of 16 bits from the instruction address and transfers to the shift register 24. In response to the read data transferred, the shift register 24 sequentially converts the read data into the serial data in accordance with the order of $D_{15}$ to $D_0$ and outputs from the serial data output terminal DO synchronously with the shift clocks SK.

Next, in the write control of FIG. 2B, in a manner similar to the read control, by setting the chip selecting terminal CS to the H level after a shift clock was supplied to the shift clock terminal SK, the enable state is derived. In this enable state when a write command "010", a write address "A₃ to A₀", and write data "D₁₅ to D₀" are given to the serial data input terminal DI, the write command, write address, and write data are converted into the parallel data in accordance with this order synchronously with the shift clocks. The write command is interpreted by the instruction decoder 26 and the memory 22 is set into the writing mode. The subsequent write address is interpreted by the address decoder 28 and the write address is designated. The parallel conversion output of the write data which is finally obtained is written into the instruction address.

Further, in the erase control of FIG. 2C, a shift clock is supplied to the shift clock terminal SK and the chip selecting terminal CS is set to the H level, thereby forming the enable state. In the enable state, an erase command "111" obtained to the serial data input terminal DI is parallel converted synchronously with the shift clocks. The erase command is interpreted by the instruction decoder 26. On the basis of the content of the erase command, the memory content in the instruction address is erased.

In the read control of FIG. 2A, after the read data $D_{15}$ to $D_0$ were serially output, the chip selecting terminal CS is set to the L level and the shift register 24 is returned into the disenable state. In the write control of FIG. 2B, after the write data were serial-to parallel converted, the chip selecting terminal CS is set to the L level. During this interval, the converted parallel data are written from the shift register 24 into the memory 22. Further, even in the erase control of FIG. 2C, after the address data "A₃ to A₀" was parallel converted, the chip selecting terminal CS is set to the L level. During this interval, the instruction address is erased. Moreover, in the write control and erase control, after completion of the data writing or data erasing operation after the chip selecting terminal SC had been set to the L level, the chip selecting terminal CS is reset to the H level. When an end command which is obtained to the serial data input terminal DI is finally received, the write control or erase control is completed once.

In the write/read unit 10 for the memory module 12 having therein the memory unit for performing the write, read, and erase controls using the shift clocks and chip selection signal shown in FIGS. 2A, 2B, and 2C, the shift clocks, chip selection signal (enable signal), and further, a power source need to be supplied to the shift register 24 in the memory unit in the memory module 12.

Therefore, the write/read unit 10 in FIG. 1 is provided with a sine wave oscillator 30 to oscillate a sine wave signal of a frequency $f_1$ (=435 kHz) for power supply; a sine wave oscillator 32 to oscillate a sine wave signal of a frequency $f_2$ (=450 kHz) for shift clocks; and a sine wave oscillator 34 to oscillate a sine wave signal of a frequency $f_3$ (=465 kHz) for enable.

Outputs of the sine wave oscillators 30, 32, and 34 are input to a multiplexer 36. The multiplexer 36 selects either one of the sine wave signals from the oscillators 30, 32, and 34 on the basis of a control signal which is output from a controller 38 using a CPU. The selected sine wave signal is supplied to the induction coil 14 for an up-signal through an amplifier 40.

The controller 38 can receive the write data from a tape reader or the like connected to the outside and can send the read data which was read out of the memory module 12 to the external apparatus and can load therein. Namely, in the write access mode in which the write data input from the external apparatus such as the tape reader or the like is written into the memory unit 12, the controller 38 converts the write data into the serial data synchronously with internal clocks and transmits. On the contrary, in the read access mode, the serial data read out of the memory module 12 is converted into the parallel data synchronously with the internal clocks by the controller 38 and loaded into the external apparatus.

When the multiplexer 36 is controlled by the controller 38, in order to set the memory module 12 into the standby mode prior to the write access or read access, the frequency signal of 435 kHz from the oscillator 30 is first selected and supplied to the induction coil 14 through the amplifier 40.

On the other hand, when the write access or read access is started, if "1" is set for the sync clock to serially transmit the write access information (write command and write address) or read access information (read command and read address), the frequency signal of 450 kHz for clocks is selected and supplied to the induction coil 14 through the amplifier 40. When "0" is set for the sync clock, the frequency signal of 465 kHz for enable is selected and supplied to the induction coil 14. These switching operations are alternately repeated.

Namely, the multiplexer 36 modulates the bit "1" of the sync clock for transmission/reception which is given from the controller 38 by the frequency signal of 450 kHz. The multiplexer 36 also modulates the bit "0" of the sync clock by the frequency signal of 465 kHz. Further when no sync clock is obtained, the multiplexer 36 supplies the frequency signal of 435 kHz for power source to the induction coil 14.

In correspondence to the frequency signals which were time-sharingly multiplexed after they had been modulated by the frequencies for the power source, clocks, and enable signal which are supplied to the induction coil 14 in the write/read unit 10, means for demodulating the chip selection signals for the operating power source, shift clocks, and enable signal from the frequency modulation signals induced by the induction coupling in the induction coil 18 is provided on the side of the memory module 12.

First, the output of the induction coil 18 is input to a rectifier 42. The rectifier 42 rectifies all of the frequency modulation signals induced in the induction coil 18 and supplies a power source voltage $+V_{cc}$ to each circuit section in the memory module 12, i.e., the non-volatile memory 22, shift register 24, instruction decoder 26, address decoder 28, band pass filters 44, 50, and 70, detecting circuits 46 and 52, waveform shaping circuits 48, 52, and 76, OR gate 56, change-over switches 68 and 82, sine wave oscillator 78, amplifier 80, and inverter 84.

On the other hand, the output of the induction coil 18 is also supplied to a band pass filter 44 to take out the frequency modulation signal of 450 kHz for the clocks. The band pass filter 44 has a pass band width in a range of ±2 to 2.5 kHz from the center frequency 450 kHz. Therefore, only the frequency modulation signal of 450 kHz for clocks is taken out from the three frequency signals of 435, 450, and 465 kHz. An output of the band pass filter 44 is given to a detecting circuit 46. Shift clocks are demodulated from the frequency modulation signal of 450 kHz by the detecting circuit 46. An output signal of the detecting circuit 46 is further waveform shaped into a square wave signal by a waveform shaping circuit 48. The demodulated shift clocks are supplied to the shift clock terminal SK of the shift register 24 in the memory unit.

On the other hand, the output of the induction coil 18 is input to a band pass filter 50 to take out the frequency modulation signal 465 kHz for enable. The band pass filter 50 has a pass band width in a range of ±2 to 2.5 kHz from the center frequency 465 kHz. Therefore, only the frequency modulation signal of 465 kHz for enable is taken out from the three frequency modulation signals of 435, 450, and 465 kHz induced in the induction coil 18. An output of the band pass filter 50 is input to a detecting circuit 52. A clock signal for enable (an inverted signal of the shift clock) is demodulated from the frequency modulation signal of 465 kHz by the detecting circuit 52 and waveform shaped by a waveform shaping circuit 54 and thereafter, it is input to one input terminal of an OR gate 56. The shift clock is supplied from the waveform shaping circuit 48 to the other input terminal of the OR gate 56. The OR of the shift clock and enable clock is calculated by the OR gate 56, thereby forming an enable signal to the chip selecting terminal CS of the shift register 24.

Namely, the shift clock shown in FIG. 3A and the enable clock shown in FIG. 3B are input to the OR gate 56. Therefore, by calculating the OR of both clocks, the enable signal which is supplied to the chip selecting terminal CS shown in FIG. 3C can be formed.

Therefore, in the write access or read access mode of the memory module 12, the frequency signal of 450 kHz for clocks is selected by the multiplexer 36 provided in the write/read unit 10 in response to the bit "1" of the sync clock which is derived from the controller 38. On the other hand, the frequency signal of 465 kHz for enable is selected in response to the bit "0" of the sync clock. Thus, for the period of time when the enable clocks are input to the OR gate 56 in the memory module 12, the chip selecting terminal CS is set to the H level and the enable state to write or read can be formed.

A transmitting system for the write data and read data which are transmitted between the controller 38 in the write/read unit 10 and the memory unit in the memory module 12 will now be explained.

First, the read/write unit 10 is provided with a multiplexer 60 to convert the write access information (write command, write address, and write data) or read access information (read command and read address) which is serially converted and output by the internal clocks from the controller into the frequency signal. A sine wave oscillator 62 to oscillate the frequency signal of 482 kHz indicative of the data bit "1" is connected to one input terminal of the multiplexer 60. The other input terminal of the multiplexer 60 is grounded to give a signal of the frequency 0 indicative of the data bit "0". Therefore, when the multiplexer 60 receives the data bit "1" from the controller 38, it outputs the frequency signal of 482 kHz. When the multiplexer 60 receives the data bit "0", it outputs the signal of the frequency 0. Namely, the output of the multiplexer 60 represents the data bit "1" or "0" in accordance with the presence or absence of the frequency signal of 482 kHz.

The output of the multiplexer 60 is also connected to the second induction coil 16 through an amplifier 64 and an analog switch 66. The frequency modulation signal of the data bit supplied to the induction coil 16 induces the frequency modulation signal in the induction coil 20 in the memory module 12. The induction coil 20 is disposed so as to face the induction coil 16 at a predetermined gap interval. The frequency modulation signal induced in the induction coil 20 in the memory module 12 is input to a band pass filter 70 through an analog switch 68. The band pass filter 70 has a pass band width in a range of ±2 to 2.5 kHz from the center frequency 482 kHz. Therefore, only the frequency modulation signal of 482 kHz induced in the induction coil 20 is taken out. An output of the band pass filter 70 is input to a detecting circuit 72. The data bit is demodulated from the frequency modulation signal of 482 kHz by the detecting circuit 72. An output signal of the detecting circuit 72 is further waveform shaped into a square wave signal by a waveform shaping circuit 76 and thereafter, the demodulated bit data is input to the serial data input terminal DI of the shift register 24 in the memory unit.

On the other hand, in order to return the serial bit data (read data) which is transmitted from the serial data output terminal DO of the shift register 24 to the write/read unit 10, a sine wave oscillator 78 to oscillate a sine wave signal of 482 kHz to frequency modulate the bit data is provided. An output of the sine wave oscillator 78 is connected to the induction coil 20 through an amplifier 80 and an analog switch 82. The analog switch 82 is turned on or off by the bit data obtained from the serial data output terminal DO of the shift register 24. Namely, when the data bit is set to "1", the analog switch 82 is turned on to supply the sine wave signal of 482 kHz to the induction coil 20. When the data bit is set to "0", the analog switch 82 is turned off to thereby stop the supply of the sine wave signal of 482 kHz to the induction coil 20. Due to the on-off control in response to the serial data bit of the analog switch 82, the serial bit data obtained from the serial data output terminal DO of the shift register 24 is converted into the frequency signal of 482 kHz in response to the bit "1", while it is converted into the signal of the frequency 0 in response to the bit "0".

On the other hand, the analog switch 68 to connect the output of the induction coil 20 with the band pass filter 72 is turned on or off by the signal derived by inverting the output of the serial data output terminal DO of the shift register 24 by an inverter 84. Namely, when the serial bit data of the read data is not output from the serial data output terminal DO, an output of the inverter 84 is at the H level, so that the analog switch 68 is turned on. When the bit is set to "1" by the read data at the serial data output terminal DO, the output of the inverter 84 is set to the L level, thereby turning off the analog switch 68.

To receive the serial transmission of the read data from the memory module 12, the output of the induction coil 16 in the write/read unit 10 is connected to a band pass filter 88 through an analog switch 86. The band pass filter 88 has a pass band width in a range of ±2 to 2.5 kHz from the center frequency 482 kHz. When the analog switch 86 is turned on, the frequency modulation signal from the memory module 12 which was induced in the induction coil 16 is taken out of the band pass filter 88 and output to a detecting circuit 90. The detecting circuit 90 demodulates the data bit from the frequency modulation signal and outputs to the controller 38.

The analog switches 66 and 86 to selectively connect the induction coil 16 are turned on or off by a control signal from the controller 38. Since the control signal of the analog switch 86 is inverted by an inverter 92, when the analog switch 66 is turned on, the analog switch 86 is certainly turned off. On the contrary, when the analog switch 86 is turned on, the analog switch 66 is turned off.

Namely, the analog switch 66 is turned on when the write access information (write command, write address, and write data) and read access information (read command and read address) are transmitted to the memory module 12. On the other hand, the analog switch 86 is turned on when receiving the read data which is sent from the memory module 12 after the read access information was transmitted.

The writing operation to the memory module 12 in the embodiment of FIG. 1 will now be described with reference to a flowchart of FIG. 4.

First, the memory module 12 is activated in step 100 prior to the write access. Namely, in the write/read unit 10, the multiplexer 36 receives a control signal from the controller 38 and selects the frequency signal of 435 kHz for power source. The selected frequency signal is amplified by the amplifier 40 and supplied to the induction coil 14.

The frequency modulation signal of 435 kHz induced in the induction coil 14 is induced in the induction coil 18 in the memory module 12 and rectified by the rectifier 42. Thus, the power source voltage $+V_{cc}$ to make each circuit section in the memory module 12 operative is derived.

In the next step 102, the chip selecting terminal CS of the shift register 24 in the memory module 12 is turned on to set the enable state. The turn-on of the chip selecting terminal CS is performed by selecting the frequency signal of 465 kHz for enable by the multiplexer 36. The frequency signal of 465 kHz induced in the induction coil 18 is demodulated by the band pass filter 50, detecting circuit 52, and waveform shaping circuit 54 and transmitted through the OR gate 56. The chip selecting terminal CS of the shift register 24 is set to the H level, thereby forming the enable state.

Subsequently, in step 104, the serial communication of the write access information, namely, the write command, write address, and write data by the controller 38 is started.

The start of the serial communication is controlled by turning on or off the frequency signal of 450 kHz for clocks by the multiplexer 36 synchronously with the clocks which are given from the controller 38. Thus, the multiplexer 36 selects the frequency signal of 450 kHz for clocks in response to the bit "1" of the sync clock and selects the frequency signal of 465 kHz for enable in response to the bit "0" of the sync clock. Therefore, in the memory module 12, the clock signal based on the frequency signal of 450 kHz is reproduced by the band pass filter 44, detecting circuit 46, and waveform shaping circuit 48 and supplied to the shift clock terminal SK of the shift register 24. At the same time, by calculating the OR of the shift clock and enable clock by the OR gate 56, the chip selecting terminal CS of the shift register 24 is held at the H level, thereby setting the memory unit into the enable state.

In the next step 106, the controller 38 outputs a control signal to the analog switches 66 and 86 to turn on the analog switch 66 and at the same time, the analog switch 86 is turned off by the inverted signal from the inverter 92. In this switching state, as shown in step 108, the controller 38 converts the parallel data consisting of the write command, write address, and write data into the serial data synchronously with the clocks and controls the multiplexer 60 on the basis of the bit output of the first bit. When the data bit is set to "1" at this time, the multiplexer 60 selects the frequency signal of 482 kHz. When the data bit is set to "0", the multiplexer 60 selects the frequency signal of the frequency 0. As shown in FIG. 2B, since the first bit of the write command is set to the data bit "1", the multiplexer 60 first selects the frequency signal of 482 kHz.

Therefore, the first bit of the write information output from the controller 38 is converted into the frequency signal of 482 kHz and supplied to the induction coil 16 and induced in the induction coil 20 in the memory module 12. At this time, since the analog switch 68 is in the ON state by the inverted output of the inverter 84, the frequency signal of the first bit induced in the induction coil 20 is given to the band pass filter 70 and waveform shaped into the square wave signal by the detecting circuit 72 and waveform shaping circuit 76. Thereafter, the first bit of the write command is supplied to the serial data input terminal DI of the shift register 24. At this time, the demodulated output of the shift clock based on the frequency signal of 450 kHz which was selected by the multiplexer 36 is given to the shift clock terminal SK of the shift register 24 synchronously with the first bit of the write command. Therefore, the shift register 24 reads the first bit of the write command given to the serial data input terminal DI synchronously with the shift clock.

Subsequently, in step 110, a check is made to see if all of the bits of the write access information have been sent or not. In this case, since the first bit has been sent, the answer is NO in step 110, so that the processing routine is returned to step 112 and a bit counter n is increased by "1". The processing routine is then returned to step 108 and the next second bit is transmitted.

In this manner, after all of the bits from the write command to the write data have been serially transmitted, the processing routine advances from step 110 to step 114. The write data converted into the parallel data by the shift register 24 is written into the memory 22.

Practically speaking, by inhibiting the selection of the frequency signal of 465 kHz for enable by the multiplexer 36, the enable clock obtained through the OR gate 56 is set to the L level. The chip selecting terminal CS is set from the ON state to the OFF state. Thus, the write data stored in the shift register 24 is written into the memory 22.

Figure 5:
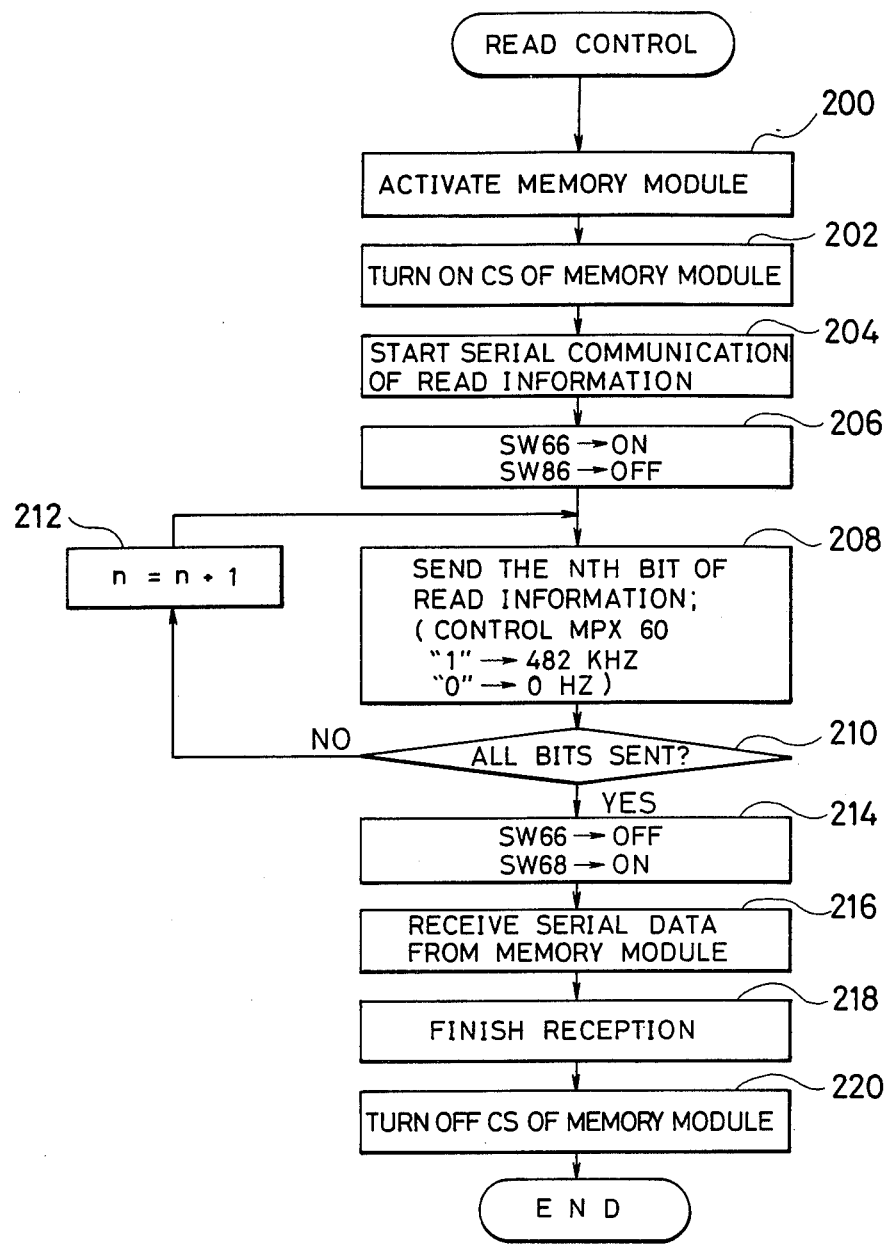
FIG. 5 is a flowchart showing a read access in FIG. 1.

The reading operation will now be explained with reference to a flowchart of FIG. 5.

First, the activation of the memory module shown in step 200 and the turn-on of the chip selecting terminal CS in the memory module shown in step 202 are the same as the processes in steps 100 and 102 in the writing operation shown in FIG. 4.

In the next step 204, the serial communication of the read access information (read command and read address) is started. Namely, in step 206, in a manner similar to the writing operation, the analog switch 66 is turned on and the analog switch 86 is turned off. In the next step 208, the first bit of the read command which was frequency modulated to 482 kHz by the bit "1" or to 0 kHz by the bit "0" is sent to the memory module 12. This frequency modulation is performed by the selective control of the frequency signal by the multiplexer 60 in accordance with the first bit of the read access information, namely, the first bit of the read command. After the first bit of the read command was sent, the processing routine advances from step 210 to step 212 and the bit counter n is increased by "1". In a manner similar to the above, each bit of the read command and read address is frequency modulated and sent to the memory module 12.

After all of the data bits of the read command and read address were serially transmitted from the write/read unit 10, the memory unit in the memory module 12 reads the instruction address data from the memory 22 to the shift register 24 on the basis of the read command and read address which are obtained from the shift register 24. Therefore, the shift register 24 starts the serial output of the bit data from the serial data output terminal DO synchronously with the shift clocks to the shift clock terminal SK.

At this time, as shown in step 214, in the write/read unit 10, the analog switch 66 is turned off and the analog switch 86 is turned on. In step 216, the reception of the serial data from the memory module 12 is started.

Namely, in the memory module 12, the analog switch 82 is turned on by the bit "1" of the serial data bit which is output from the serial data output terminal DO of the shift register 24. The frequency signal of 482 kHz is output to the induction coil 20. On the contrary, the analog switch 82 is turned off by the data bit "0" to thereby stop the output of the frequency signal of 482 kHz to the induction coil 20. Thus, the frequency signals of 482 kHz and 0 kHz according to the read data bit are induced in the induction coil 16 in the write/read unit 10. The data bit of the read data is demodulated by the band pass filter 88 and detecting circuit 90 through the analog switch 86 in the ON state and sent to the controller 38.

In step 218, after all of the read data from the memory module 12 were received, the controller 38 inhibits the selection of the frequency signal of 465 kHz for enable by the multiplexer 36. Thus, in step 220, the enable signal to the chip selecting terminal CS of the shift register 24 in the memory module 12 is stopped. A series of reading operations are finished.

Further, in the erase control for the memory module 12, by executing processes similar to those in the writing operations shown in the flowchart of FIG. 4 excluding the transmitting process of the write data, the data in the designated address in the memory 22 can be erased.

What is claimed is:

1. A memory package system comprising a write/read unit and a memory module, said memory module having a non-volatile memory therein;
   (A) said write/read unit and said memory module respectively comprising first and second induction coils for up-signal transmission from said write/read unit to said memory module, and write/read unit and said memory module respectively comprising third and fourth induction coils for bidirectional transmission therebetween;
   (B) said write/read unit further comprising:
      (i) an up-signal transmitting means for modulating a power source signal at a first frequency, a sync clock signal at a second frequency which is different from said first frequency, and an enable clock signal at a third frequency which is different from said first and second frequencies, and for frequency multiplexing the thus modulated power source signal, sync clock and enable clock signal, and for transmitting the thus frequency multiplexed power source signal, sync clock signal and enable clock signal to said memory module using said first and second induction coils,
      (ii) an access information transmitting means for modulating write access information and read access information into different frequencies, and for transmitting the thus modulated write access information and read access information to said memory module using said third and fourth induction coils, and
      (iii) a read data demodulating means for demodulating read data from a frequency modulated signal received from said memory module and transmitted using said third and fourth induction coils;
   (C) said memory module further comprising:
      (i) a first demodulating means for producing an operating power, a sync clock and enable signal in accordance with said frequency multiplexed power source signal, sync clock signal and enable clock signal received from said write/read unit and transmitted using said first and second induction coils;
      (ii) a second demodulating means for reproducing said write access information and said read access information in accordance with said modulated write access information and read access information received form said write/read unit and transmitted using said third and fourth induction coils;
      (iii) a memory control means for executing writing and reading operations of said non-volatile memory in accordance with said write access information and said read access information reproduced by said second demodulating means,
      (iv) a read data transmitting means for frequency modulating read data obtained as a result of reading operations executed by said memory control means and for transmitting the thus frequency modulated read data to said write/read unit using said third and fourth induction coils.

2. A memory package system according to claim 1, wherein said up-signal transmitting means includes:
   a first oscillator for outputting a signal of said first frequency;
   a second oscillator for outputting a signal of said second frequency;
   a third oscillator for outputting a signal of said third frequency;
   a multiplexer connected to said first, second and third oscillators for selectively outputting a signal of said first frequency while in a standby mode, and for selectively outputting a signal of said second frequency during a first logic level of said sync clock signal, and for selectively outputting a signal of said third frequency during a second logic level of said sync clock signal, wherein said sync clock signal is a binary signal having said first and second logic levels.

3. A memory package system according to claim 1, wherein said first demodulating means includes:
   a rectifier for rectifying said frequency multiplexed power source signal, sync clock signal and enable clock signal received from said write/read unit and for producing said operating power;
   a clock demodulator for reproducing said modulated sync clock signal of said second frequency and outputting said sync clock in accordance with the reproduced modulated sync clock signal;
   an enable clock demodulator for reproducing said modulated enable clock signal of said third frequency and outputting said enable clock signal in accordance with the reproduced modulated enable clock signal; and an OR gate for outputting said enable signal on the basis of the OR of said sync clock and said enable clock signal.

4. A memory package system according to claim 1, wherein said memory control means includes:

a shift register for reading said write access information and read access information reproduced by said second demodulating means as serial data by application of said sync clock when said shift register receives said enable signal from said first demodulating means, and for converting said write and read access information into parallel data, and for outputting said parallel data;

an instruction decoder for interpreting an access command which is output from said shift register; and an address decoder of interpreting an instruction address which is output from the shift register.

5. A memory package system according to claim 1, wherein said write access information transmitted from said write/read unit to said memory module is serial bit data consisting of a write command, a write address, and write data, and wherein the read access information is serial bit data consisting of a read command and a read address.

6. A memory package system according to claim 1, further comprising:

a first switching means for selectively connecting an output of said access information transmitting means to said third induction coil and for selectively connecting an output of said fourth induction coil to said second demodulating means when said memory package is in one of a write access and read access mode; and a second switching means for selectively connecting an output of said read data transmitting means to said fourth induction coil and for selectively connecting and output of said third induction coil to said read data demodulating means when read data is transmitted from said memory module to said write/read unit.

* * * * *